United States Patent
Hirose

(10) Patent No.: US 6,388,487 B1
(45) Date of Patent: May 14, 2002

(54) SCHMITT CIRCUIT

(75) Inventor: Shinichi Hirose, Hyogo (JP)

(73) Assignees: Mitsubishi Denki Kabushiki Kaisha, Tokyo; Mitsubishi Electric System LSI Design Corporation, Itami, both of (JP)

(*) Notice: Subject to any disclaimer, the term of this patent is extended or adjusted under 35 U.S.C. 154(b) by 0 days.

(21) Appl. No.: 09/576,765

(22) Filed: May 24, 2000

(30) Foreign Application Priority Data

Jun. 4, 1999 (JP) .......................................... 11-158595

(51) Int. Cl.[7] ................................................ H03K 3/12
(52) U.S. Cl. ........................ 327/205; 327/206; 327/215
(58) Field of Search ................................ 327/112, 205, 327/206, 199, 202, 203, 210, 215, 219; 326/21, 26, 27, 82, 83, 86

(56) References Cited

U.S. PATENT DOCUMENTS

| 4,369,381 A | * | 1/1983 | Okamoto et al. ........... 327/206 |
| 4,539,489 A | * | 9/1985 | Vaughn ...................... 327/206 |
| 5,120,999 A | * | 6/1992 | Schreck et al. ............... 326/27 |
| 5,594,361 A | * | 1/1997 | Campbell .................... 326/83 |

FOREIGN PATENT DOCUMENTS

JP          6-343025         12/1994

* cited by examiner

*Primary Examiner*—Terry D. Cunningham
*Assistant Examiner*—Paul Dinh
(74) *Attorney, Agent, or Firm*—Burns, Doane, Swecker & Mathis, LLP

(57) ABSTRACT

By turning OFF a PMOS transistor 15a of a feedback inverter 15 as the signal level at an input node 6 gradually changes from the "L" to "H" level, a high-level output from the feedback inverter 15 to an intermediate node 7 is limited, or by tuning OFF an NMOS transistor 15b of the feedback inverter 15 as the signal level at the input node gradually changes from the "H" to "L" level, a low-level output from the feedback inverter 15 to the intermediate node 7 is limited. Hence, the hysteresis width can be narrowed by limiting the output to the intermediate node 7 from the feedback inverter 15 which functions to expand the hysteresis width.

12 Claims, 12 Drawing Sheets

FIG.2

| POWER-SUPPLY VOLTAGE (V) | 2 | | 5 | |
|---|---|---|---|---|
| CIRCUIT SYSTEM | EMBODIMENT 1 | PRIOR ART | EMBODIMENT 1 | PRIOR ART |
| $V_{1H}(V)$ | 1.05 | 1.31 | 2.95 | 2.89 |
| $V_{1L}(V)$ | 0.90 | 0.51 | 2.15 | 2.15 |
| HYSTERESIS WIDTH (V) | 0.15 | 0.80 | 0.80 | 0.74 | ent
SCHMITT CIRCUIT

BACKGROUND OF THE INVENTION

1. Field of the Invention

The present invention relates to a Schmitt circuit that is used as an input circuit of a CMOS semiconductor IC device.

2. Description of the Prior Art

FIG. 12 illustrates in block form a conventional Schmitt circuit. Reference numeral 1 denotes generally a CMOS semiconductor IC device; 12 denotes a Schmitt circuit provided therein; 3 denotes an input side inverter which inverts a signal from an input node 6 and outputs it to an intermediate a node 7; 4 denotes an output side inverter which inverts the signal from the intermediate node 7 and outputs it to an output node 8; and 5 denotes feedback inverter which inverts the signal from the output node 8 and outputs it to the intermediate node 7.

In the input side inverter 3, reference numeral 3a denotes a power supply VCC; 3b denotes a P-channel MOS transistor (hereinafter referred to as a PMOS transistor); 3c denotes an N-channel MOS transistor (hereinafter referred to as an NMOS transistor); and 3d denotes a low, ground-level power supply VSS. In the output side inverter 4, reference numeral 4a denotes a PMOS transistor; and 4b an NMOS transistor. In the feedback inverter 5, reference numeral 5a denotes a PMOS transistor; and 5b denotes an NMOS transistor.

FIG. 2 is a table showing characteristics of a Schmitt circuit according to Embodiment 1 of the present invention and the conventional Schmitt circuit. As shown in the table, the Schmitt circuit 12 has, for its input signal, an H-side threshold value $V_{IH}$ and a smaller L-side threshold value $V_{IL}$, and the difference between these threshold values is called a hysteresis width.

In the case where the input signal changes from the "H" to "L" level, the Schmitt circuit 12 yields an H (high-level) output at the time the input signal exceeds the threshold value $V_{IH}$, whereas when the input signal changes from the "L" to "H" level, the Schmitt circuit 12 yields an L (low-level) output at the time the input signal goes below the threshold value $V_{IL}$. Consequently, even if the waveform of the input signal is distorted, the Schmitt circuit is capable of providing the output signal without being affected by the distortion as long as the amplitude of the distortion is within the hysteresis width.

Now, the operation of the conventional Schmitt circuit 12 will be described. The input side inverter 3 is formed by the PMOS and NMOS transistors 3b and 3c of high driving power; the inverter 3 inverts the signal from the input node 6 and outputs the inverted signal to the intermediate node 7 with high intensity. The output side inverter 4 inverts the signal from the intermediate node 7 and outputs the inverted signal to the output node 8. The feedback inverter 5 is formed by the PMOS and NMOS transistors 5a and 5b of low driving power as compared with the transistors 3b and 3b; the inverter 5 inverts the signal from the output node 8 and outputs the inverted signal to the intermediate node 7 with low intensity.

As a result, when the signal at the input node 6 is low-level, the signal to the intermediate node 7 goes high and the signal to the output node 8 low. When the signal at the input node 6 is high-level, the signal to the intermediate node 7 goes low and the signal to the output node 8 high.

In the case where the signal level at the input node 6 gradually changes from "L" to "H" level and is going to exceed the threshold value of the input side inverter 3, it inverts the low-level signal from the input node 6 and outputs the inverted high-level signal to the intermediate node 7, but the output intensity (hereinafter referred to simply as intensity) gradually decreases. When the input signal level has just exceeded the threshold value, the inverter 3 outputs a low-level signal with low intensity and then the output intensity gradually increases. On the other hand, since the output side inverter 4 has inverted the high-level signal from the intermediate node 7 and is outputting the inverted low-level signal to the output node 8 at the time the input side inverter 3 is providing the low-level signal to the output node 8, the feedback inverter 5 inverts the low-level signal from the output node 8 and applies the inverted high-level signal to the intermediate node 8 with low intensity.

Accordingly, the input side inverter 3 outputs a high-level signal to the intermediate node 7 with low intensity first and then provides thereto a low-level signal with low intensity at first when the input signal level has just exceeded the threshold value. As long as the output side inverter 4 outputs a low-level signal, the feedback inverter 8 applies a high-level signal to the intermediate node 7 with low intensity; hence, the signal level at the intermediate node 7 does not go low immediately even if the input signal level at the input node 6 exceeds the threshold value of the input side inverter 3. Thereafter, even if the feedback inverter 5 still continues to output the high-level signal to the intermediate node 7 with low intensity, the output side inverter 4 inverts the low-level signal from the intermediate node 7 and outputs the inverted high-level signal to the output node 8 at the time the signal level at the intermediate node 7 is made low by a high-intensity low-level output from the input side inverter 3, and the feedback inverter 5 inverts the high-level signal from the output node 8 and applies the inverted high-level signal to the intermediate node 7. Thus, the Schmitt circuit operates stably.

Since the conventional Schmitt circuit has such a construction as described above, the hysteresis width does not becomes no narrow even if the voltage of the power supply VCC 3a falls low due to performance variations of transistors. In some cases, the hysteresis width becomes rather wide.

In FIG. 2 there are shown measured values of the hysteresis width of the conventional Schmitt circuit. With the power supply voltage set at 5 V, the threshold values $V_{IH}$ and $V_{IL}$ are 2.89 V and 2.15 V, respectively, and the hysteresis width, is 0.74 V; when the power supply voltage is 2 V, the threshold values $V_{IH}$ and $V_{IL}$ are 1.31 V and 0.51 V, respectively and the hysteresis width is. 0.80 V. That is, the hysteresis width does not vary with the rte of change of power supply voltage as desired.

In this instance, the lower the power supply voltage, the higher the rate of the hysteresis width to the power supply voltage and the narrower the widths between a predetermined high level of the input signal and the threshold value $V_{IH}$ and between a predetermined low level of the input signal and the threshold value $V_{IL}$—this imposes difficulty on the signal providing side in satisfying such conditions.

For the same reasons, when the power supply voltage is low, a dull input signal causes a delay in the output.

SUMMARY OF THE INVENTION

It is therefore an object of the present invention to provide a Schmitt circuit which permits reduction of the hysteresis width.

According to an aspect of the present invention, there is provided a Schmitt circuit which includes a feedback inverter which limits the intensity of its output signal to the intermediate node in accordance with a signal from the input node.

According to another aspect of the present invention, there is provided a Schmitt circuit which includes a NOR circuit which outputs the NOR of a control signal and a signal from the input node and a feedback inverter which limits the intensity of its output signal to the intermediate node in accordance with the signal from the input node.

According to another aspect of the present invention, there is provided a Schmitt circuit which includes a NAND circuit which outputs the NAND of a control signal and a signal from the input node and a feedback inverter which limits the intensity of its output signal to the intermediate node in accordance with the signal from the input node.

According to another aspect of the present invention, there is provided a Schmitt which includes with a hysteresis width control circuit which: operates under the control of a hysteresis width control signal; inverts a signal from the output node and outputs the inverted signal to the intermediate node; and limits the intensity of its output signal to the intermediate node in accordance with a signal from the input node.

According to another aspect. of the present invention, there is provided a Schmitt circuit which includes a feedback inverter in which: a power supply, first and second PMOS transistors, first and second NMOS transistors and a low power supply are connected in series in this order; the connection point of the second PMOS transistor and the first NMOS transistor is connected to the intermediate node; the second PMOS transistor and the NMOS transistor have their gates connected to the output node, and the second PMOS transistor and the first NMOS transistor have their gates connected to the input node; or the second PMOS transistor and the first NMOS transistor have their gates connected to the output node, and the first PMOS transistor and the second NMOS transistor have their gates connected to the input node.

According to another aspect of the present invention, there is provided a Schmitt circuit which includes a feedback inverter in which: first and second NMOS transistors and a low power supply are connected in series in this order; the connection point of the first and second NMOS transistors is connected to the intermediate node; and the second NMOS transistor has its gate connected to the output node, and the first NMOS transistor has its gate connected to the input node; or the first NMOS transistor has its gate connected to the output node, and the second NMOS transistor has its gate connected to the input node.

According to another aspect of the present invention, there is provided a Schmitt circuit which includes a feedback inverter in which: a power supply, first and second PMOS transistors are connected in series in this order; the connection point of the first and second PMOS transistors is connected to the intermediate node; and the first PMOS transistor has its gate connected to the output node, and the second PMOS transistor has its gate connected to the input node; or the second PMOS transistor has its gate connected to the output node, and the first NMOS transistor has its gate connected to the input node.

According to still another aspect of the present invention, there is provided a Schmitt circuit which includes a feedback inverter which has: an inverter in which a power supply, a first PMOS transistor, a first NMOS transistor and a low power supply are connected in this order, the first PMOS and NMOS transistors having their gates connected to the output node; and a switching circuit in which second PMOS and NMOS transistors are connected in opposing relation to each other, the second PMOS and NMOS transistors having their gates connected to the input node, and which limits the intensity of the output signal to the intermediate node via the connection point of the first PMOS and NMOS transistors of the inverter.

BRIEF DESCRIPTION OF THE DRAWINGS

Other object, features and advantages of the present invention will become more apparent from the following description taken in conjunction with the accompanying drawings, in which:

FIG. 2 is a table showing characteristics of a Schmitt circuit according to a first embodiment of the present invention and a conventional Schmitt circuit;

DETAILED DESCRIPTION OF THE PREFERRED EMBODIMENTS

Embodiment 1

Figure 1:
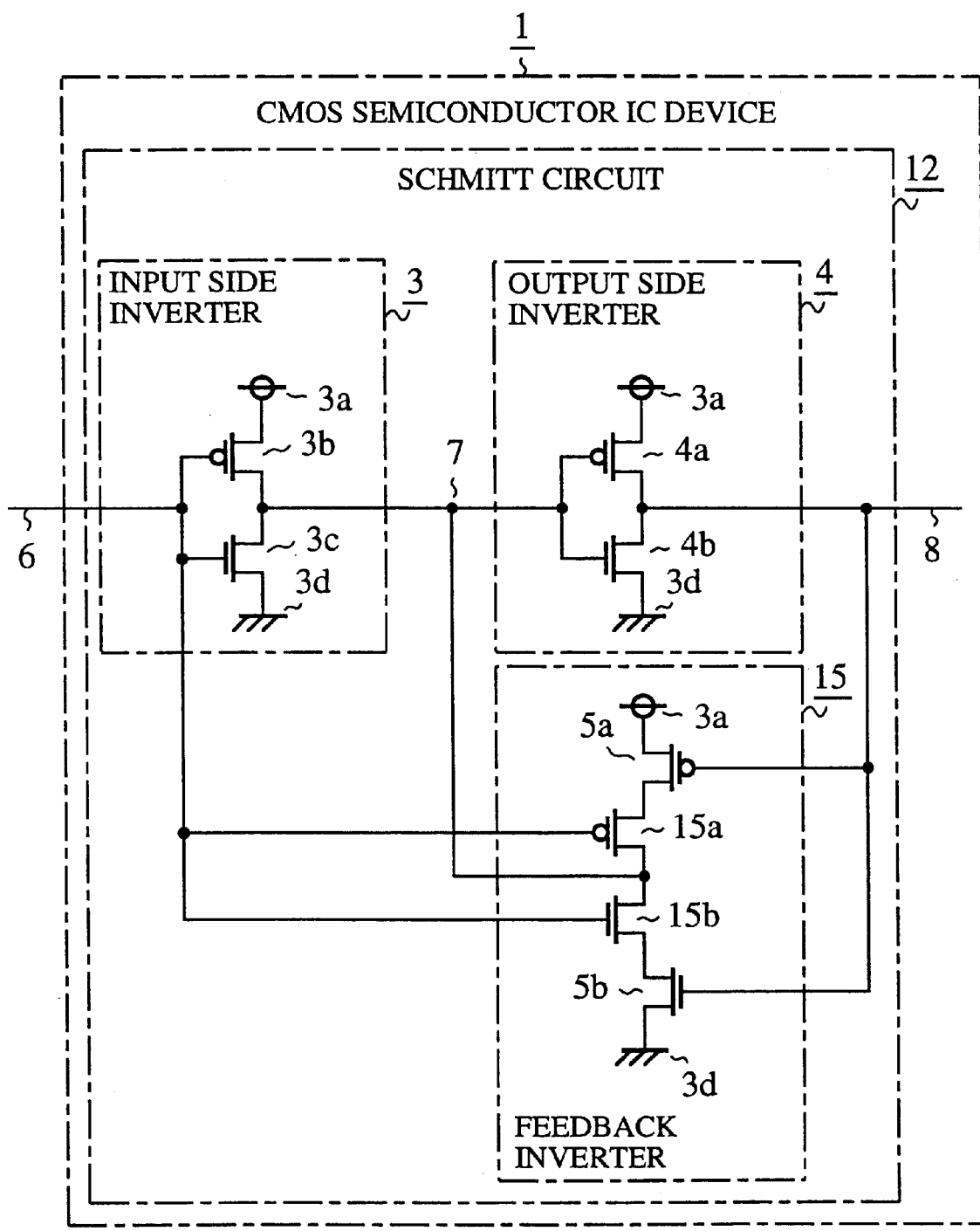
FIG. 1 is a block diagram of a Schmitt circuit according to a first embodiment of the present invention.

FIG. 1 illustrates in block form a Schmitt circuit according to a first embodiment (Embodiment 1). Reference numeral 1 denotes generally a CMOS semiconductor IC device; 12 denotes a Schmitt circuit provided therein; 3 denotes an input side inverter which inverts a signal from an input node 6 and outputs the inverted signal to an intermediate node 7; 4 denotes an output side inverter which inverts the signal from the intermediate node 7 and outputs the inverted signal to an output node 8; and 15 denotes feedback inverter which inverts the signal from the output node 8 and outputs the inverted signal to the intermediate node 7 while at the same time controlling the output intensity of the inverted signal in accordance with the signal from the input node.

In the input side inverter 3, reference numeral 3a denotes a power supply VCC; 3b denotes a P-channel MOS transistor (hereinafter referred to as a PMOS transistor); 3c denotes an N-channel MOS transistor (hereinafter referred to as an NMOS transistor); and 3d denotes a low, ground-level power supply VSS. In the output side inverter 4, reference numeral 4a denotes a PMOS transistor; and 4b an NMOS transistor.

In the feedback inverter 15, reference numeral 5a denotes a first PMOS transistor; 5b denotes a second NMOS transistor; and 15a denotes a first NMOS transistor. A power supply VCC 3a, the PMOS transistors 5a and 15a, the NMOS transistors 15b and 5b, and a power supply VSS 3d are connected in series in this order. The connection point of the PMOS transistor 15 and the NMOS transistor 15 is connected to the intermediate node 7. The PMOS and NMOS transistors 5a and 5b have their gates connected to the output node 8. The PMOS and NMOS transistors 15a and 15b have their gates connected to the input node 6.

FIG. 2 is a table showing characteristics of the Schmitt circuit according to Embodiment 1 of the present invention and the conventional Schmitt circuit. As shown in the table, the Schmitt circuit 12 has, for its input signal, an H-side threshold value $V_{IH}$ and a smaller L-side threshold value $V_{IL}$, and the difference between these threshold values is called a hysteresis width.

In the case where the input signal changes from the "H" to "L" level, the Schmitt circuit 12 yields a high-level output at the time the input signal exceeds the threshold value $V_{IH}$, whereas when the input signal changes from the "L" to "H" level, the Schmitt circuit 12 yields a low-level output at the time the input signal goes below the threshold value $V_{IL}$. Consequently, even if the waveform of the input signal is distorted, the Schmitt circuit is capable of providing the output signal irrespective of the distortion as long as the amplitude of the distortion stays within the hysteresis width.

Turning back to FIG. 1, the operation of the conventional Schmitt circuit 12 will be described. The input side inverter 3 is formed by the PMOS and NMOS transistors 3b and 3c of high driving power; the inverter 3 inverts the signal from the input node 6 and outputs the inverted signal to the intermediate node 7 with high intensity. The output side inverter 4 inverts the signal from the intermediate node 7 and outputs the inverted signal to the output node 8. The feedback inverter 15 is formed by the PMOS transistors 5a and 15a and the NMOS transistors 5b and 15b all of which have low driving power as compared with the transistors 3a and 3b. The feedback inverter 5 inverts the signal from the output node 8 and outputs the inverted signal to the intermediate node 7 with low intensity.

As a result, when the signal at the input node 6 is low-level, the signal to the intermediate node 7 goes high and the signal to the output node 8 low. When the signal at the input node 6 is high-level, the signal to the intermediate node 7 goes low and the signal to the output node 8 high.

In the case where the signal level at the input node 6 gradually changes from "L" to "H" level and is going to exceed the threshold value of the input side inverter 3, it inverts the low-level signal from the input node 6 and outputs the inverted high-level signal to the intermediate node 7, but the output intensity gradually decreases; when the input signal level has just exceeded the threshold value, the inverter 3 outputs a low-level signal with low intensity and then the output intensity gradually increases. On the other hand, since the output side inverter 4 has inverted the high-level signal from the intermediate node 7 and is outputting the inverted low-level signal to the output node 8 at the time the input side inverter 3 is providing the low-level signal to the output node 8, the feedback inverter 5 inverts the low-level signal from the output node 8 and applies the inverted high-level signal to the intermediate node 8 with low intensity.

At this time, however, since the signal from the input node 6 is being applied to the gate of the PMOS transistor 15a of the feedback inverter 15, the PMOS transistor 15a turns OFF as the signal level at the input node 6 gradually varies from the "L" to "H" level, thereby limiting the high-level output from the feedback inverter 15 to the intermediate node 7.

Accordingly, the input side inverter 3 outputs a high-level signal to the intermediate node 7 with low intensity first and then applies thereto a low-level signal with low intensity at first when the input signal level has just exceeded the threshold value. However, since the feedback inverter 15 applies a high-level signal to the intermediate node 7 with low output intensity until the PMOS transistor 15a of the feedback inverter 15 turns ON after the output side inverter 4 outputs a low-level signal, the signal level at the intermediate node 7 does not go low immediately even if the input signal level at the input node 6 exceeds the threshold value of the input side inverter 3. Thereafter, even if the feedback inverter 15 still continues to output the high-level signal to the intermediate node 7 with low intensity, the output side inverter 4 inverts the low-level signal from the intermediate node 7 and outputs the inverted high-level signal to the output node 8 at the time the signal level at the intermediate node 7 is made low by a high-intensity low-level output from the input side inverter 3, and the feedback inverter 15 inverts the high-level signal from the output node 8 and applies the inverted low-level signal to the intermediate node 7. Thus, the Schmitt circuit operates stably.

Incidentally, when the NMOS transistor 5b is turned ON and the feedback inverter 15 outputs a high-level signal to the intermediate node 7, a high-level signal from the input node 6 has already been applied to the gate of the NMOS transistor 15b of the feedback inverter 15, and consequently the NMOS transistor 15b is already in the ON state and the low-level output from the feedback inverter 15 to the intermediate node 7 will not be limited.

In the case where the signal level at the input node 6 gradually changes from "H" to "L" level and is going to exceed the threshold value of the input side inverter 3, it inverts the high-level signal from the input node 6 and outputs the inverted low-level signal to the intermediate node 7, but the output intensity gradually decreases; when the input signal level has just exceeded the threshold value, the inverter 3 outputs a high-level signal with low intensity and then the output intensity gradually increases. On the other hand, since the output side inverter 4 has inverted the low-level signal from the intermediate node 7 and is outputting the inverted high-level signal to the output node 8 at the time the input side inverter 3 is outputting the low-level signal, the feedback inverter 15 inverts the high-level signal from the output node 8 and applies the inverted low-level signal to the intermediate node 8 with low intensity At this time, however, since the signal from the input node 6 is being applied to the gate of the NMOS transistor 15b of the feedback inverter 15, the PMOS transistor 15b turns OFF as the signal level at the input node 6 gradually varies from the "H" to "L" level, thereby limiting the low-level output from the feedback inverter 15 to the intermediate node 7.

Accordingly, the input side inverter 3 outputs a low-level signal to the intermediate node 7 with low intensity first and then applies thereto a high-level signal with low intensity at first when the input signal level has just exceeded the threshold value. However, since the feedback inverter 15 applies a low-level signal to the intermediate node 7 with low output intensity until the NMOS transistor 15b of the feedback inverter 15 turns OFF after the output side inverter 4 outputs a high-level signal, the signal level at the intermediate node 7 does not go high immediately after the input signal level at the input node 6 exceeds the threshold value of the input side inverter 3. Thereafter, even if the feedback inverter 15 still continues to output the low-level signal to the intermediate node 7 with low intensity, the output side inverter 4 inverts the high-level signal from the intermediate node 7 and outputs the inverted low-level signal to the output node 8 at the time the signal level at the intermediate node 7 is made high by a high-intensity high-level output from the input side inverter 3, and the feedback inverter 15 inverts the low-level signal from the output node 8 and applies the inverted high-level signal to the intermediate node 7. Thus, the Schmitt circuit operates stably.

Incidentally, when the PMOS transistor 5a is turned. ON and the feedback inverter 15 outputs a high-level signal to the intermediate node 7, a low-level signal from the input node 6 has already been applied to the gate of the PMOS transistor 15a of the feedback inverter 15, and consequently the PMOS transistor 15b is already in the ON state and the high-level output from the feedback inverter 15 to the intermediate node 7 will not be limited.

Next a description will be given of the influence of the Embodiment 1 configuration on the threshold values $V_{IH}$ and $V_{IL}$ when the power-supply voltage is low.

When the power-supply voltage is nearly equal to the sum of threshold values Vtp and Vtn of the PMOS and NMOS transistor, the threshold value of the input side inverter 3 formed by the PMOS and NMOS transistors 3b and 3c is approximately equal to the level Vtn of the input signal without being so much affected by the β-ratio of the PMOS and NMOS transistors 3b and 3c. The reason for this is that when the input level is higher than the level Vtn (that is, when the difference between the power-supply voltage and the input level is smaller than the absolute value of Vtp), the PMOS transistor 3b is in the OFF state, whereas when the input level is smaller than Vtn, the NMOS transistor 3c rapidly turns ON. The same is true of the threshold values of the PMOS and NMOS transistors 15 and 15b of the feedback inverter 15.

In the case where the input level at the input node 6 changes from the "L" to "H" level, when the input level is low at first, the PMOS transistor 3b of the input side inverter 3 is in the ON state, and consequently the signal level at the intermediate node 7 is high, turning ON the NMOS transistor 4b of the output side inverter 4 and thereby causing it to output a low-level signal to the output node 8. The feedback inverter 15 is outputting a high-level signal to the intermediate node 7 because the PMOS transistors 5a and 15a are in the ON state. Then, when the input level at the input node 6 gradually rises and is about to exceed the threshold value Vtn of the NMOS transistor 3c, the PMOS transistor 3b proceeds toward the OFF state and instead the NMOS transistor 3c proceeds toward the ON state. As the PMOS transistor 3b proceeds toward the ON state, the PMOS transistor 15a of the feedback inverter 15 also proceeds toward the ON state. Accordingly, soon after the input level at the input node 6 has exceeded the threshold value Vtn, the signal level at the intermediate node 7 goes low and the signal level at the output node 8 goes high. In the feedback inverter 15 the NMOS transistor 5b turns ON in place of the PMOS transistor 5a, and the NMOS transistor 15b also serves to increasingly lower the, level of the output signal to the intermediate node 7 as the input level at the input node 6 gradually rises.

In the case where the input level at the input node 6 changes from the "H" to "L" level, too, as the input level drops below the threshold value Vtn, the PMOS and NMOS transistors 3b and 3c of the input side inverter 3 proceed toward the ON state and the NMOS transistor 15b of the feedback inverter 15 also proceeds toward the OFF state. Hence, soon after the input level at the input node 6 drops below the threshold value Vtn, the signal level at the intermediate node 7 goes high and the signal level at the output node 8 low.

In FIG. 2 there are shown measured results on Embodiment 1 in comparison with the measured values on the afore-mentioned prior art example.

With a 5-V power-supply voltage, the threshold values $V_{IH}$ and $V_{IL}$ are 2.95 V and 2.15 V, respectively, and the hysteresis width is 0.80 V. When the power-supply voltage is 2 V, the threshold values $V_{IH}$ and $V_{IL}$ are 1.05 V and 0.90 V, respectively, and the hysteresis width is 0.15 V; the hysteresis width decreases with a decrease in the power-supply voltage.

As described above, according to Embodiment 1, there is provided in the Schmitt circuit the feedback inverter 15 which controls the output intensity of the signal to the intermediate node 7 in accordance with the signal fed thereto from the input node 6. As the signal level at the input node 6 gradually changes from the "L" to "H" level, the PMOS transistor 15a of the feedback inverter 15 turns OFF, limiting the output intensity of the high-level signal from the feedback inverter 15 to the intermediate node 7. And, as the signal level at the input node 6 gradually changes from the "H" to the "L" level, the NMOS transistor 15b of the feedback inverter 15 turns OFF, limiting the output intensity of the low-level signal from the feedback inverter 15 to the intermediate node 7. By limiting the output to the intermediate node 7 from the feedback inverter 15 which serves to expand the hysteresis width, it is possible to narrow the hysteresis width.

Embodiment 2

Figure 3A:
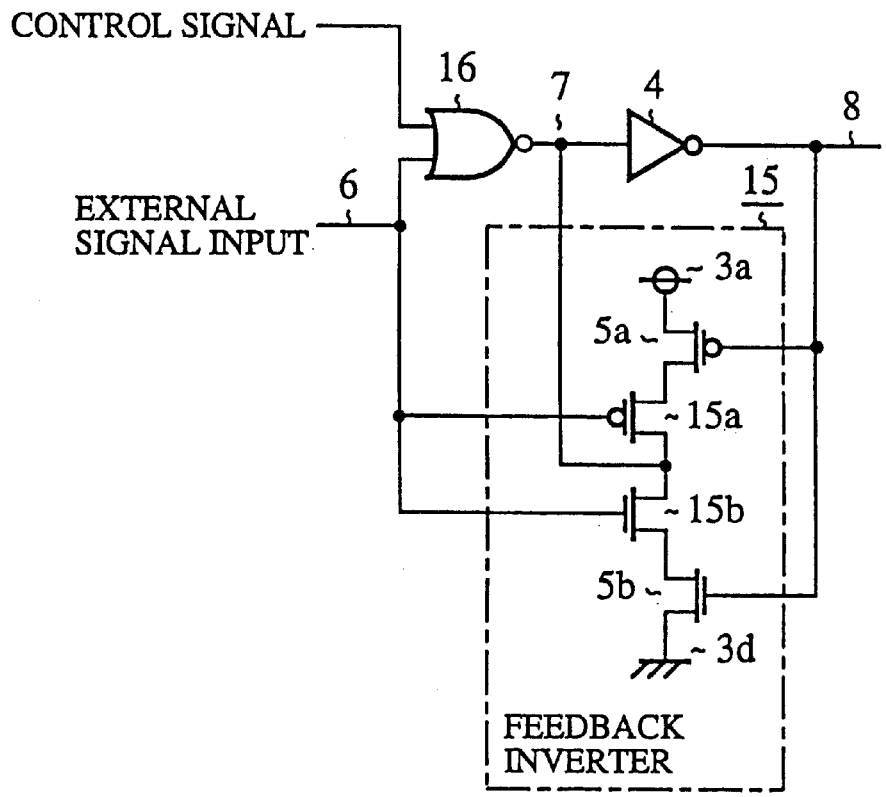
FIG. 3 is a block diagram of a Schmitt circuit according to a second embodiment of the present invention.

FIG. 3 schematically depicts a Schmitt: circuit according to a second embodiment (Embodiment 2) of the present invention. In FIG. 3(a), reference numeral 16 denotes a NOR circuit which provides to the intermediate node 7 the NOR of a control signal and a signal from the input node 6.

Figure 3B:
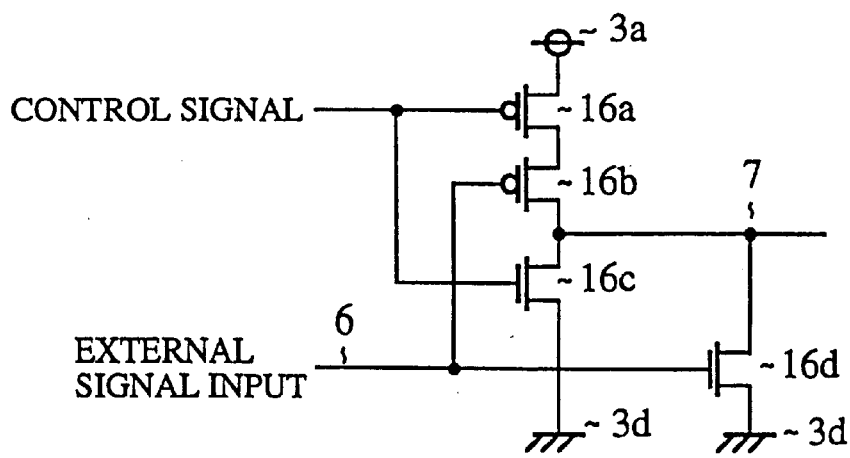

FIG. 3(b) is a detailed circuit diagram of the NOR circuit 16. Reference numeral 16a denotes a PMOS transistor to the gate of which is applied a control signal; 16b denotes a PMOS transistor which is connected in series to the PMOS transistor 16a and to the gate of which is applied an external signal input from the input node 6; 16c denotes an NMOS transistor which is connected in series to the PMOS transistor 16 and to the gate of which is applied the control signal; and 16d denotes an NMOS transistor which is connected to the intermediate node 7 and to the gate of which is applied the external signal input from the input node 6.

This embodiment is identical in construction with Embodiment 1 except the above. No description will be repeated on the identical parts.

As depicted in FIG. 3, this embodiment employs, as a substitute for the input side inverter 3, the NOR circuit 16 from which the NOR of the control signal and the signal from the input node 6 is provided to the intermediate node 7.

When a high-level signal is applied as the control signal to the NOR circuit 16, its output to the intermediate node 7 is fixed at the low level, and hence the signal level at the output node 8 can be fixed at the high level.

When a low-level signal is provided as the control signal, the Schmitt circuit operates in the same manner as does the Schmitt circuit of Embodiment 1 since the output from the NOR circuit 16 to the intermediate node 7 depends on the external signal input from the input node 6.

Since this embodiment substitutes the input side inverter 3 with the NOR circuit 16 which provides the NOR of the control signal and the signal from the input node 6 to the intermediate node 7 as described above, it is possible to produce the following effect as well as the effect obtainable with Embodiment 1. That is, for example, an open-drain output, a signal for A/D conversion, or A/D converted output can be used as the external signal input; when no Schmitt input function is needed, if the signal level at the output node 8 is fixed high by a control signal, that is, if the Schmitt output is fixed, no useless current flows across the Schmitt circuit even when the terminal voltage is at an intermediate potential.

Embodiment 3

Figure 4A:
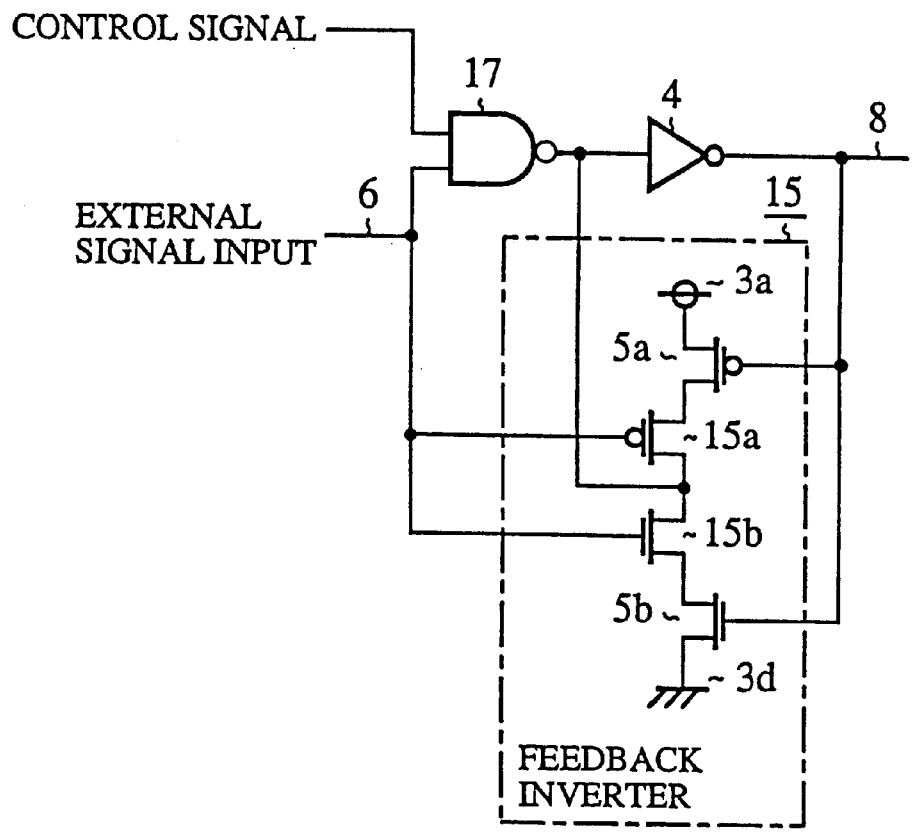
FIG. 4 is a block diagram of a Schmitt circuit according to a third embodiment of the present invention.

FIG. 4(a) is a circuit diagram of a Schmitt circuit according to a third embodiment (Embodiment 3) of the present invention. Reference numeral 17 denotes a NAND circuit which provides the NAND of a control signal and the signal from the input node 6 to the intermediate node 7.

Figure 4B:
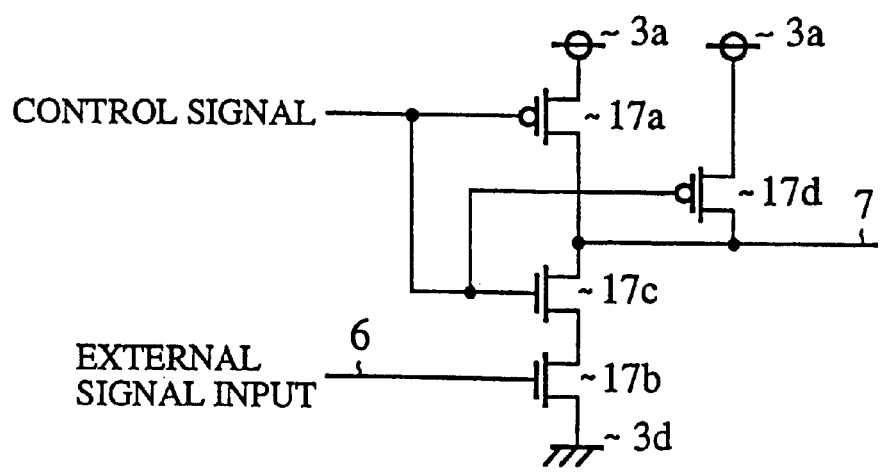

FIG. 4(b) is a detailed circuit diagram of the NAND circuit 17. Reference numeral 17a denotes a PMOS transistor to the gate of which is applied the control signal; 17b denotes an NMOS transistor which connected in series to the PMOS transistor 17a and to the gate of which is applied the external signal input from the input node; 17c denotes an NMOS transistor which is connected in series to the NMOS transistor 17b and to the gate of which is applied the control signal; and 17d denotes a PMOS transistor which is connected to the intermediate node 7 and to the gate of which is applied the external signal input from the input node 6.

This embodiment is identical in construction with Embodiment 1 except the above. No description will be repeated on the identical parts.

As depicted in FIG. 4, this embodiment employs, as a substitute for the input side inverter 3, the NAND circuit 17 from which the NAND of the control signal and the signal from the input node 6 is provided to the intermediate node 7.

When a low-level signal is applied as the control signal to the NAND circuit 17, its output to the intermediate node 7 is fixed at the high level, and hence the signal level at the output node 8 can be fixed at the low level.

When a high-level signal is provided as the control signal, the Schmitt circuit operates in the same manner as does the Schmitt circuit of Embodiment 1 since the output from the NAND circuit 17 to the intermediate node 7 depends on the external signal input from the input node 6.

Since this embodiment substitutes the input side inverter 3 with the NAND circuit 17 which provides the NAND of the control signal and the signal from the input node 6 to tile intermediate node 7 as described above, it is possible to produce the following effect as well as the effect obtainable with Embodiment 1. That is, for example, an open-drain output, a signal for A/D conversion, or A/D converted output can be used as the external signal input; when no Schmitt input function is needed, if the signal level at the output node 8 is fixed high by a control signal, that is, if the Schmitt output is fixed, no useless current flows across the Schmitt circuit even when the terminal voltage is at an intermediate potential.

Embodiment 4

Figure 5:
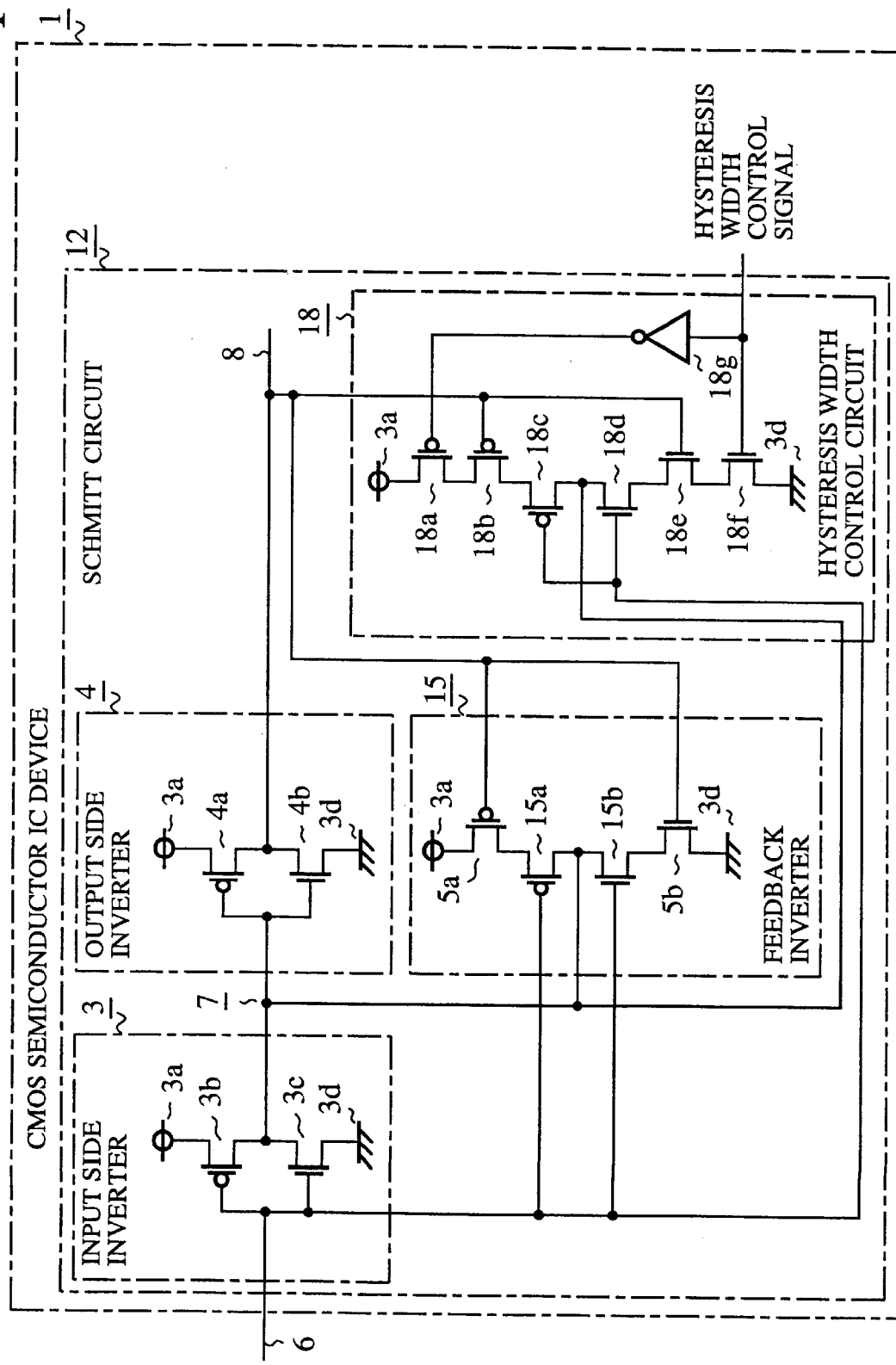
FIG. 5 is a block diagram of a Schmitt circuit according to a fourth embodiment of the present invention.

FIG. 5 is a circuit diagram of a Schmitt circuit according to a fourth embodiment (Embodiment 4) of the present invention. Reference numeral 18 denotes a hysteresis width control circuit which is placed under the control of a hysteresis width control signal and which inverts the signal from the output node 8 and outputs the inverted signal to the intermediate node 7 while at the same time limiting the intensity of the output signal in accordance with the signal from the input node 6.

In the hysteresis width control circuit 18, reference numerals 18a to 18c denotes PMOS transistors; 18d to 18f denote NMOS transistors, which are connected in series between the power supplies VCC 3a and VSS 3d; 18g denotes an inverter which inverts the hysteresis width control signal and outputs it to the gate of the PMOS transistor 18a.

The PMOS and NMOS transistors 18b and 18e have their gates connected to the output node 8. The PMOS and NMOS transistors 18c and 18d have their gates connected to the input node 6. To the gate of the NMOS transistor 18f is provided the hysteresis width control signal.

This embodiment is identical in construction with Embodiment 1 except the above. No description will be repeated on the identical parts.

The series circuit of the PMOS transistors 18b, 18c and the NMOS transistors 18d, 18e, which is connected between VCC 3 and VSS 3d in the hysteresis width control circuit 18, is identical in configuration with the series circuit of the PMOS transistors 5a, 15a and the NMOS transistors 5b, 15b in the feedback inverter 15. The series circuit of the hysteresis width control circuit 18 inverts the signal from the output node 8 and outputs it to the intermediate node 7 while at the same time limiting the intensity of the output signal in accordance with the signal from the input node 6.

By actuating this series circuit by turning ON the PMOS and NMOS transistors 18a and 18f in response to the hysteresis width control signal, the intensity-limited output signal is provided to the intermediate node 7 together with the signal thereto from the feedback inverter 15, with the result that the feedback signal to the intermediate node 7 becomes large. Thus, the hysteresis width can be expanded accordingly.

While in the above this embodiment has been described to use one hysteresis width control circuit 18, it is also possible to two or more such hysteresis width control circuits and actuate them in response to different hysteresis width control signals. In this instance, the hysteresis width can be controlled over a wider range than in the case of using only one hysteresis width control circuit.

Furthermore, in this embodiment the hysteresis width control circuit 18 is combined with the FIG. 1 configuration, but it may also be combined with the configurations of FIGS. 3 and 4.

As described above, this embodiment employs the hysteresis width control circuit 18 which is actuated in response to the hysteresis width control signal and inverts the signal from the output node 8 and outputs it to the intermediate node 7 while at the same time limiting the intensity of the output signal in accordance with the signal from the input node 6. By actuating the hysteresis width control circuit 18 in response to the hysteresis width control signal, the intensity-limited output signal is added to the feedback signal from the inverter 15 to the intermediate node 7, and hence the feedback signal to the intermediate node 7 becomes large, enabling the hysteresis width to be expanded accordingly.

Embodiment 5

Figure 6:
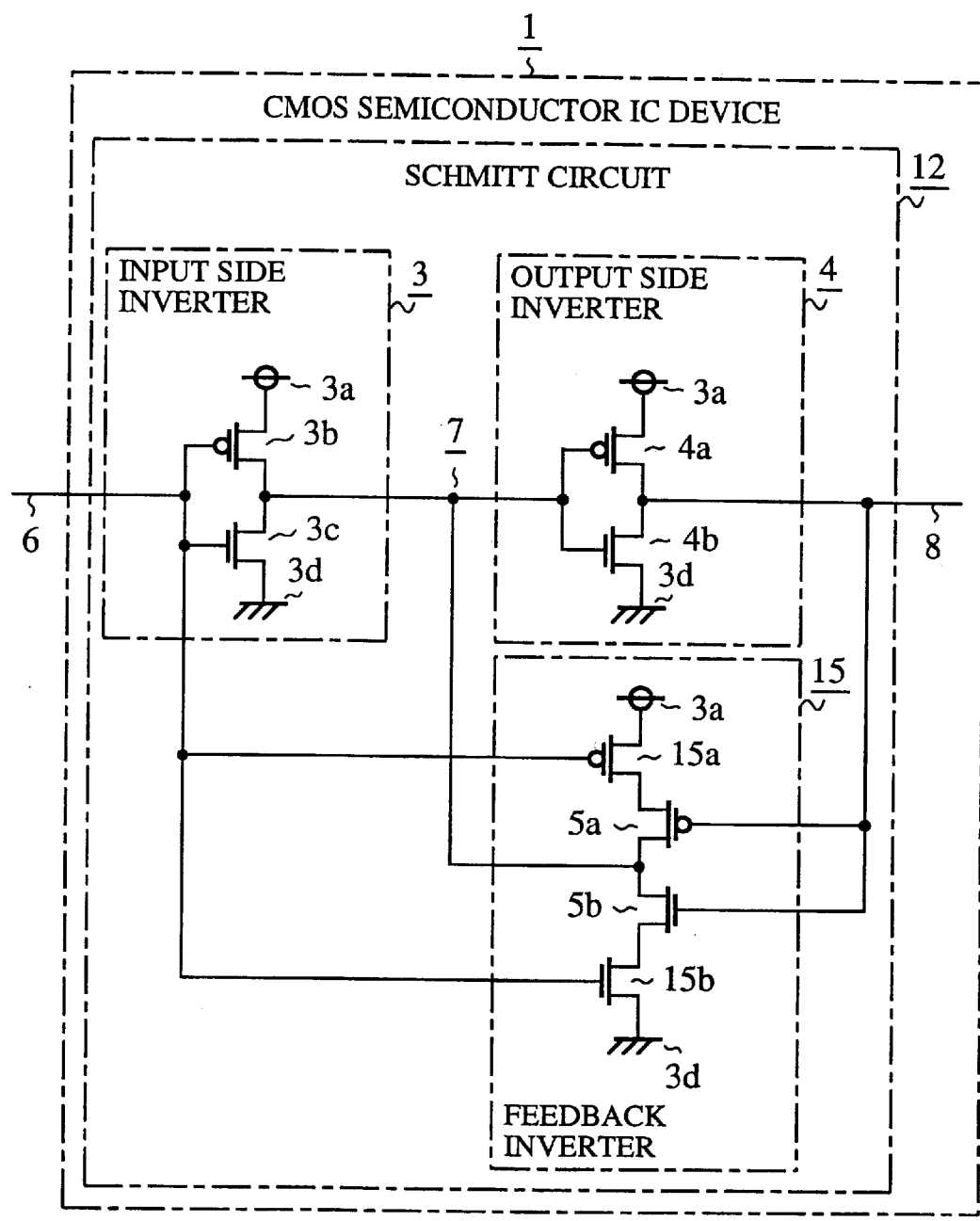
FIG. 6 is a block diagram of a Schmitt circuit according to a fifth embodiment of the present invention.

FIG. 6 is a circuit diagram of a Schmitt circuit according to a fifth embodiment (Embodiment 5) of the present invention, in which the feedback inverter 15 differs from the FIG. 1 embodiment in the order of connection of its circuit elements.

The order of connection in this embodiment is VCC 3a—PMOS transistor (first PMOS) 15a—PMOS transistor (second PMOS) 5a—NMOS transistor (first NMOS) 5b—NMOS transistor (second NMOS) 15b—VSS 3d.

This embodiment is identical in construction with Embodiment 1 except the above. No description will be repeated on the identical parts.

The configuration of FIG. 6 differs from the FIG. 1 embodiment in a method of determining the sizes of the transistors used but is identical in operation and in effect.

While this embodiment is shown to use a modified form of the feedback inverter 15 used in Embodiment 1, the illustrated modification can freely be applied to the feedback inverters in FIGS. 3 to 5 and the hysteresis width control circuit 18 in FIG. 5 as well.

Embodiment 6

Figure 7:
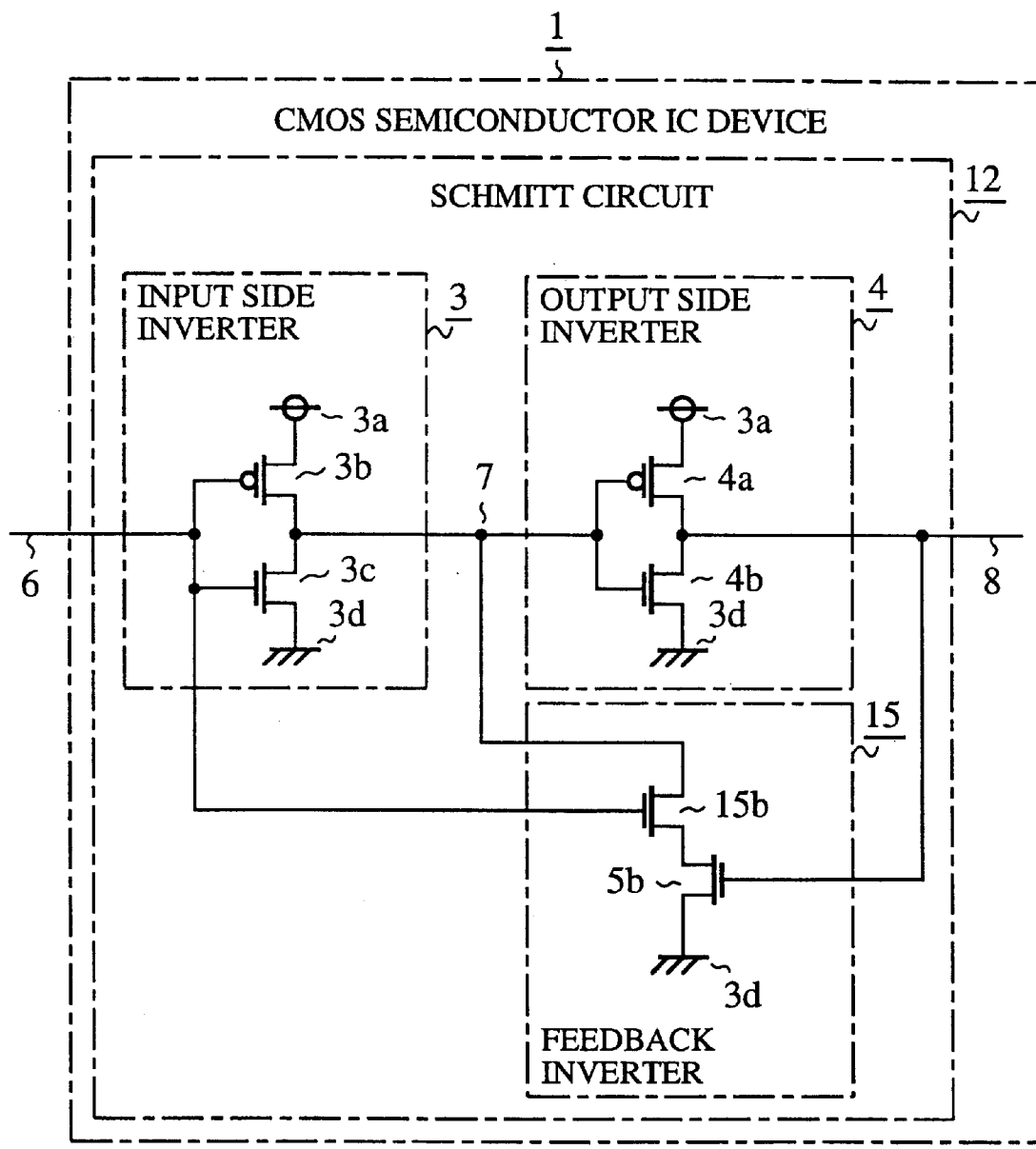
FIG. 7 is a block diagram of a Schmitt circuit according to a sixth embodiment of the present invention.

FIG. 7 is a circuit diagram of a Schmitt circuit according to a sixth embodiment (Embodiment 6) of the present invention, in which the feedback inverter 15 differs from the FIG. 1 embodiment 1 in that the VCC 3a and the PMOS transistors 5a and 15a are dispensed with.

In this embodiment, the order of connection is NMOS transistor (first NMOS) 15b—NMOS transistor (second NMOS) 5b—VSS 3d.

This embodiment is identical in construction with Embodiment 1. No description will be repeated on the identical parts.

In FIG. 7, when the signal level at the input node 6 changes from the "L" to "H" level, the levels at the input node 6, the intermediate node 7 and the output node 8 are low, high and low, respectively. Since only the NMOS transistor 5b of the feedback inverter 15 is connected to the output node 8, the NMOS transistor 5b does not turn ON in response to the low level at the output node 8. Accordingly, when the level at the input node 6 changes from the "L" to "H" level, the threshold value $V_{IH}$ is equal to that of the first-stage inverter alone.

When the signal level at the input node 6 gradually changes from the "H" to "L" level and is about to exceed the threshold value of the input side inverter 3, the feedback inverter 15 inverts a high-level signal from the output node 8 and provides the inverted low-level signal to the intermediate node 7 with low intensity, and at the same time the signal from the input node 6 is being applied to the gate of the NMOS transistor 15b of the feedback inverter 15. Hence, as the level at the input node 6 gradually changes from the "H" to "L" level, the NMOS transistor 15b turns OFF, limiting the intensity of the low-level signal from the feedback inverter 15 to the intermediate node 7.

While this embodiment is shown to use another modified form of the feedback inverter 15 used in Embodiment 1, the illustrated modification can freely be applied to the feedback inverters in FIGS. 3 to 5 and the hysteresis width control circuit 18 in FIG. 5 as well.

According to this embodiment, since the feedback inverter 15 has the configuration with the NMOS transistor 15b, the NMOS transistor 5b and the VSS 3d connected in this order as described above, the threshold value $V_{IH}$ at the input node is dependent on the threshold value of the fist-stage inverter alone and the threshold value VIL is dependent on a combination with the feedback circuit. This produces an effect that the characteristic by the present invention is obtainable on the side of the threshold value $V_{IL}$ alone.

Embodiment 7

Figure 8:
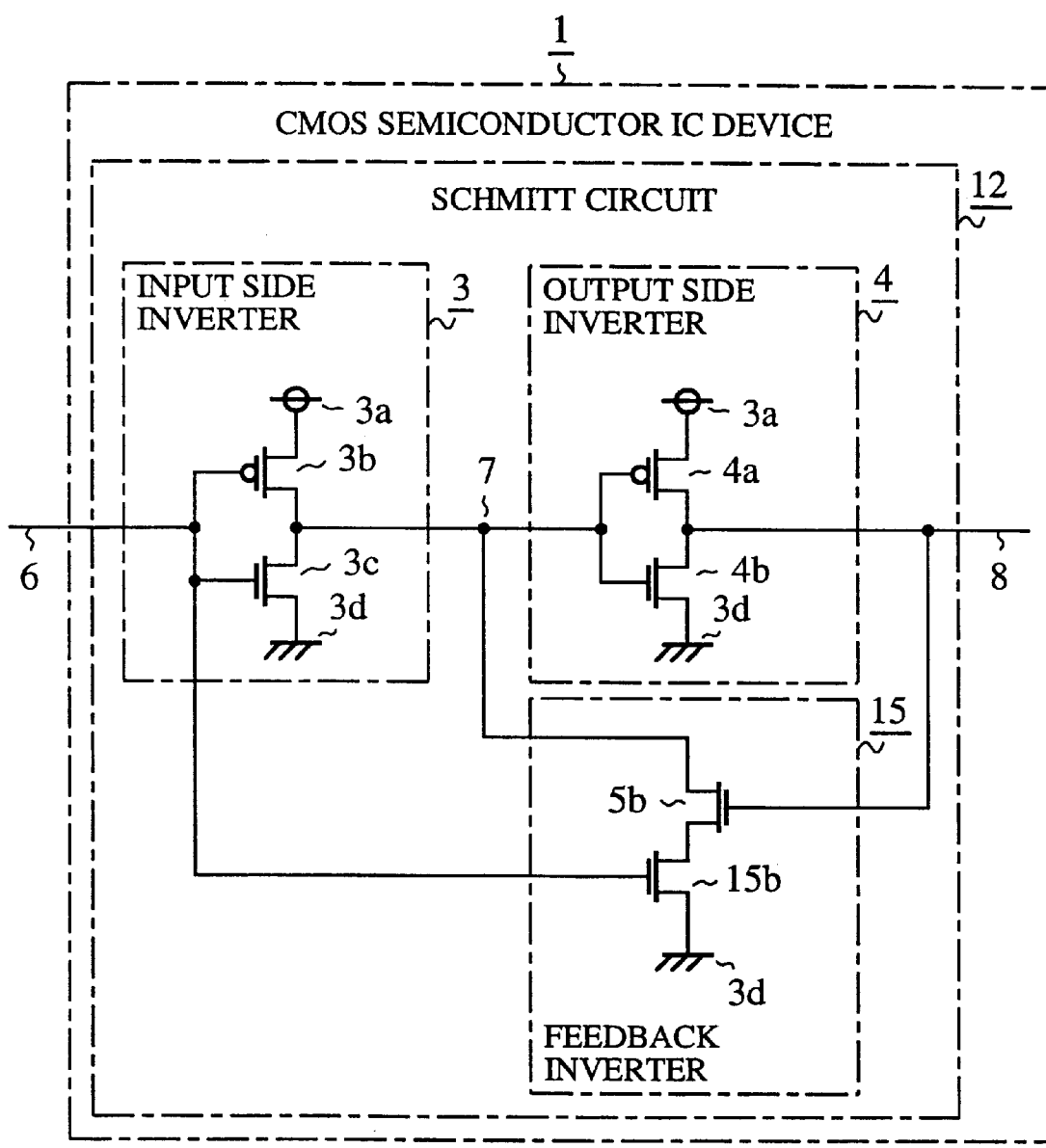
FIG. 8 is a block diagram of a Schmitt circuit according to a seventh embodiment of the present invention.

FIG. 8 is a circuit diagram of a Schmitt circuit according to a seventh embodiment (Embodiment 7) of the present invention, in which the feedback inverter 15 dispenses with the VCC 3a and the PMOS transistors 5a and 15a used in the FIG. 6 embodiment.

In this embodiment, the order of connection is NMOS transistor (first NMOS) 5b—NMOS transistor (second NMOS) 15b—VSS 3d.

This embodiment is identical in construction with Embodiment 5. No description will be repeated on the identical parts.

The configuration of FIG. 8 differs from the FIG. 7 embodiment in a method of determining the sizes of the transistors used but is common to Embodiment 6 in operation and in effect.

While this embodiment is shown to use a modified form of the feedback inverter 15 used in Embodiment 6, the illustrated modification can freely be applied to the feedback inverters in FIGS. 3 to 5 and the hysteresis width control circuit 18 in FIG. 5 as well.

Embodiment 8

FIG. 8 is a circuit diagram of a Schmitt circuit according to an eighth embodiment (Embodiment 8) of the present invention, in which the feedback inverter 15 differs from the FIG. 1 embodiment 1 in that the NMOS transistors 5b and 15b and VSS 3d are dispensed with.

In this embodiment, the order of connection is VCC 3a—PMOS transistor (first PMOS) 5a—PMOS transistor (second PMOS) 15a.

This embodiment is identical in construction with Embodiment 1. No description will be repeated on the identical parts.

Figure 9:
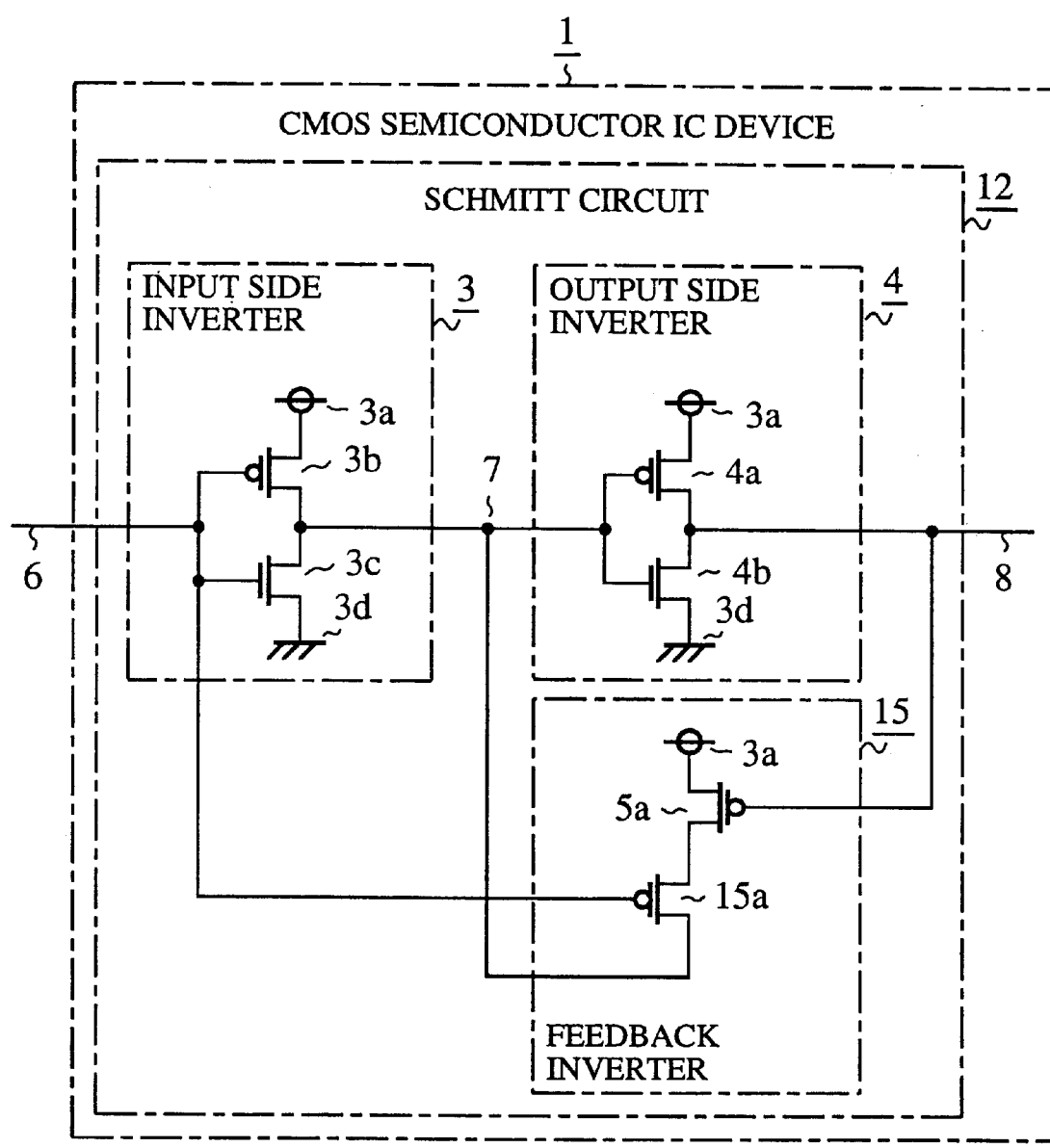
FIG. 9 is a block diagram of a Schmitt circuit according to an eighth embodiment of the present invention.

In FIG. 9, when the signal level at the input node 6 gradually changes from the "L" to "H" level and is about to exceed the threshold value of the input side inverter 3, the feedback inverter 15 inverts a low-level signal from the output node 8 and provides the inverted high-level signal to the intermediate node 7 with low intensity, and at the same time the signal from the input node 6 is being applied to the gate of the PMOS transistor 15a of the feedback inverter 15. Hence, as the level at the input node 6 gradually changes from the "L" to "H" level, the PMOS transistor 15a turns OFF, limiting the intensity of the high-level signal from the feedback inverter 15 to the intermediate node 7.

When the signal level at the input node 6 changes from the "H" to "L" level, the levels at the input node 6, the intermediate node 7 and the output node 8 are high, low and high, respectively. Since only the PMOS transistor 5a of the feedback inverter 15 is connected to the output node 8, the PMOS transistor 5a does not turn ON in response to the high level at the output node 8. Accordingly, when the level at the input node 6 changes from the "H" to "L" level, no hysteresis is likely to appear.

While this embodiment is shown to use another modified form of the feedback inverter 15 used in Embodiment 1, the illustrated modification can freely be applied to the feedback inverters in FIGS. 3 to 5 and the hysteresis width control circuit 18 in FIG. 5 as well.

According to this embodiment, the feedback inverter 15 has the configuration with the VCC 3a, the PMOS transistor 5a and the PMOS transistor 15a connected in this order as described above. Hence, by limiting the output to the intermediate node 7 from the feedback inverter 15 which does not exhibit any hysteresis when the signal level at the input node 6 changes from the "H" to "L" level and which functions to expand the hysteresis width when the signal at the input node 6 changes from the "L" to the "H" level, it is possible to narrow the hysteresis width.

With the use of this modification, it is possible to make simple-structured, as compared with Embodiment 1, a Schmitt circuit of the type that requires a hysteresis only when the signal level at the input node 6 changes from the "L" to "H" level.

Embodiment 9

Figure 10:
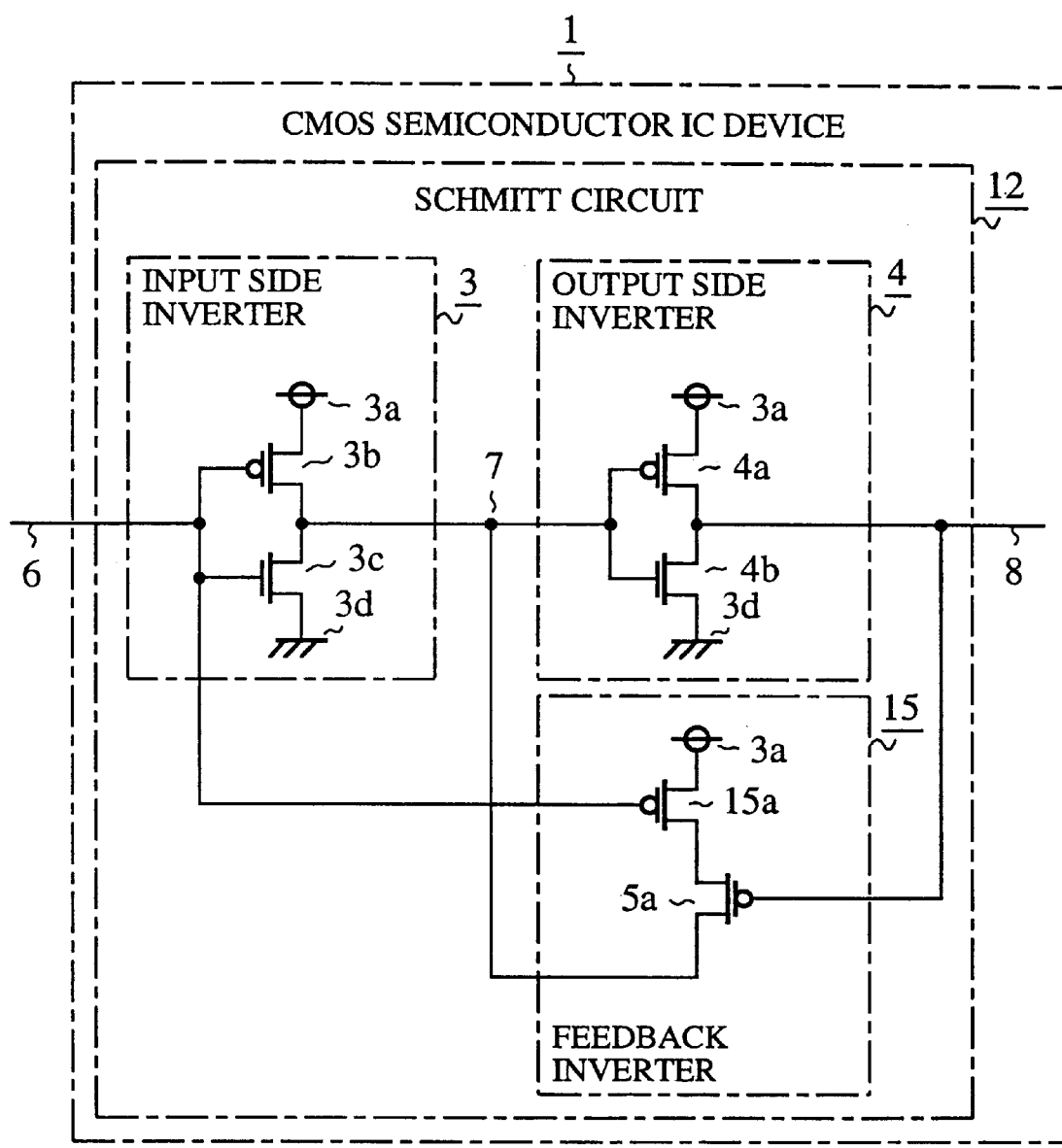
FIG. 10 is a block diagram of a Schmitt circuit according to a ninth embodiment of the present invention.

FIG. 10 is a circuit diagram of a Schmitt circuit according to a ninth embodiment (Embodiment 9) of the present invention, in which the feedback inverter 15 dispenses with the NMOS transistors 5b and 15b and VSS 3d used in the FIG. 6 embodiment.

In this embodiment, the order of connection is VCC 3a—PMOS transistor (first PMOS) 15a—PMOS transistor (second PMOS) 5a.

This embodiment is identical in construction with Embodiment 5. No description will be repeated on the identical parts.

The configuration of FIG. 10 differs from the FIG. 9 embodiment in a method of determining the sizes of the transistors used but is common to Embodiment 8 in operation and in effect.

While this embodiment is shown to use a modified form of the feedback inverter 15 used in Embodiment 8, the illustrated modification can freely be applied to the feedback inverters in FIGS. 3 to 5 and the hysteresis width control circuit 18 in FIG. 5 as well.

Embodiment 10

Figure 11:
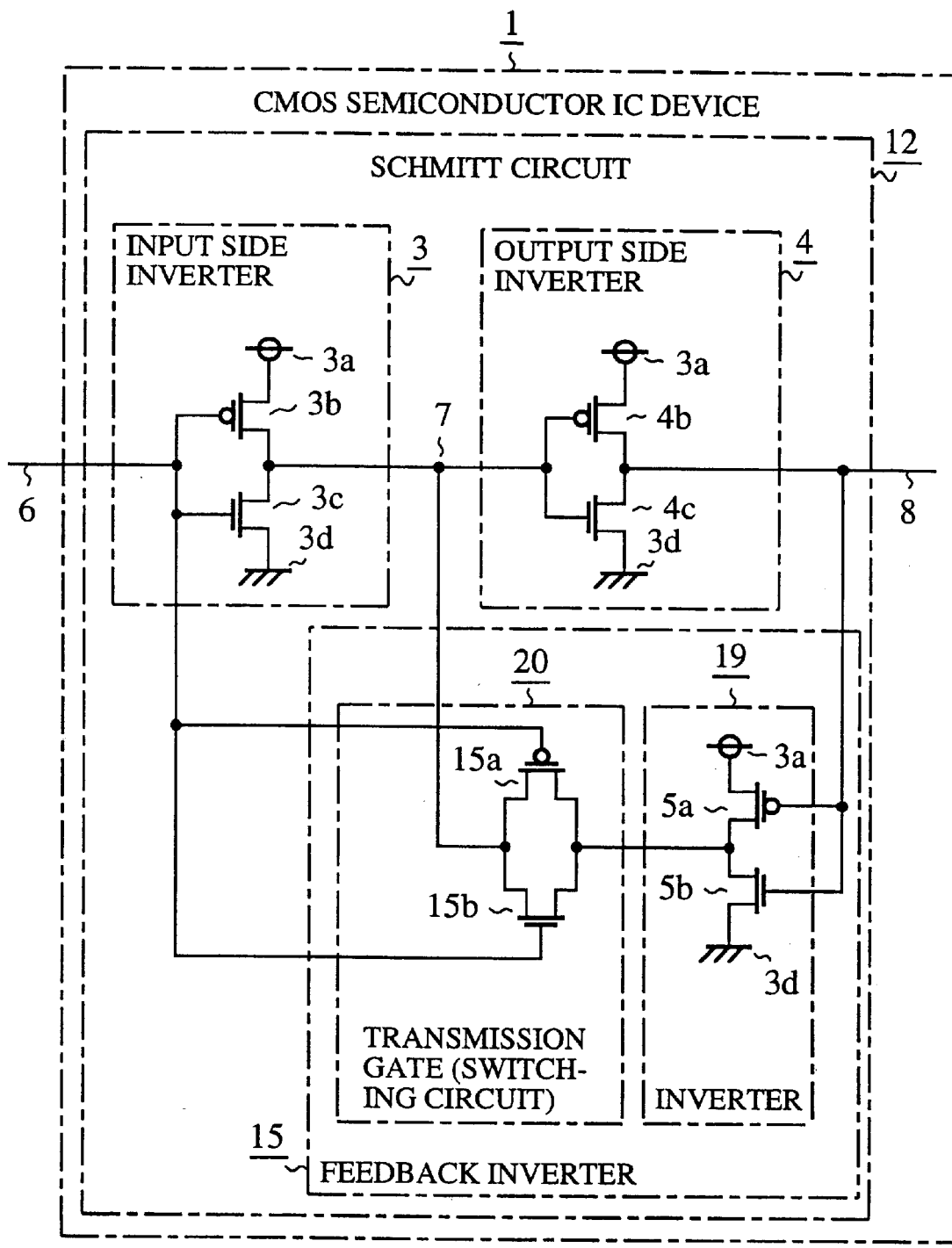
FIG. 11 is a block diagram of a Schmitt circuit according to a tenth embodiment of the present invention.
Figure 12:
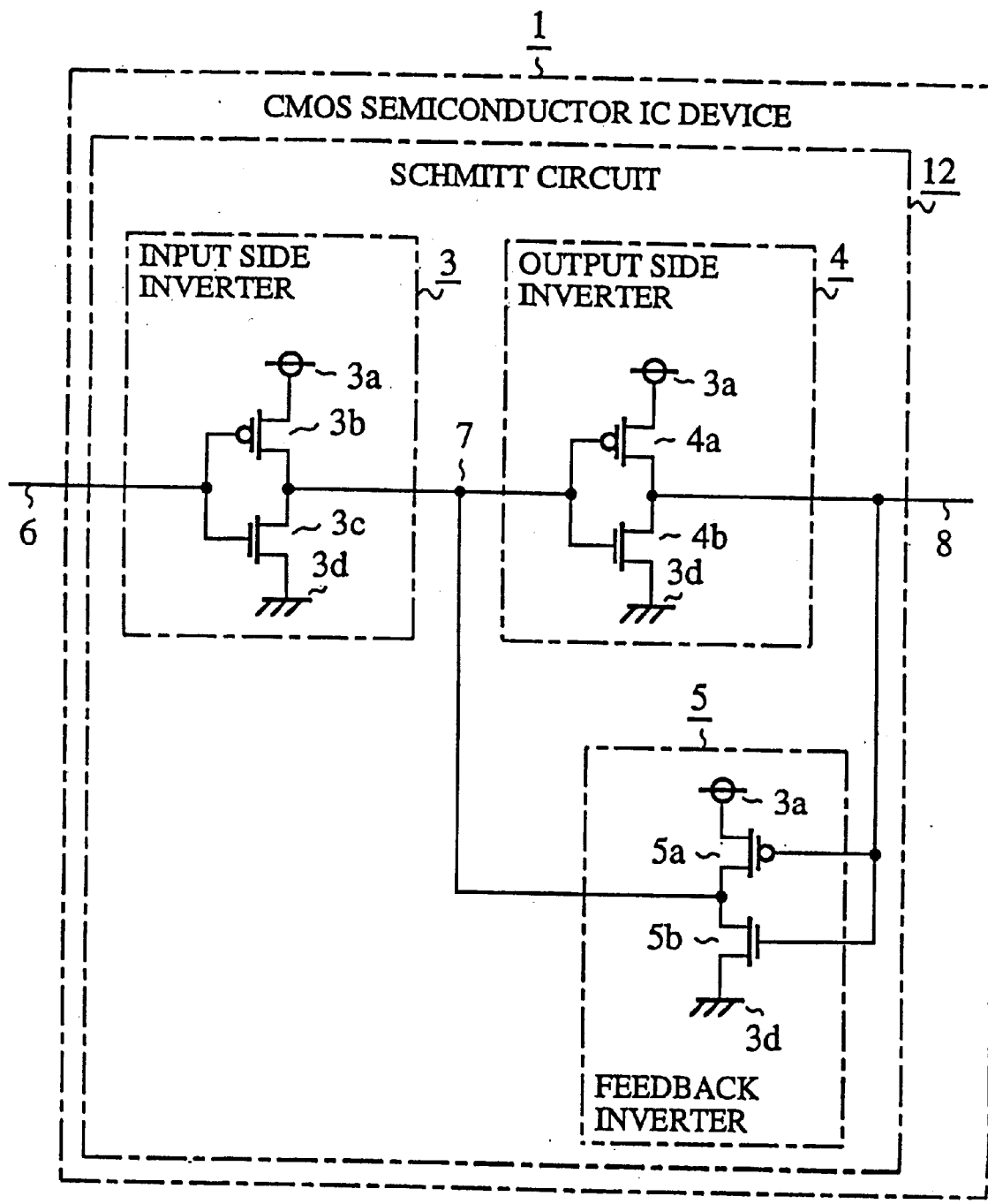
FIG. 12 is a block diagram of a conventional Schmitt circuit.

FIG. 11 is a circuit diagram of a Schmitt circuit according to a tenth embodiment (Embodiment 10) of the present invention. In this embodiment the feedback inverter 15 comprises an inverter 19 which is identical in construction with the feedback inverter 5 described previously with reference to the prior art example, and a transmission gate (switching circuit) 20 which limits the output intensity of a signal that is provided to the intermediate node 6 from the connection point of the PMOS and NMOS transistors 5a and 5b of the inverter 19.

In the inverter 19, the power supply VCC 3a, the PMOS transistor 5a and the NMOS transistor 5b and the power supply VCC 3d are connected in series in this order, and the gates of the PMOS and NMOS transistors 5a and 5b are connected to the output node 8.

In the transmission gate 20, the PMOS and NMOS transistors are connected in opposing relation to each other with their gate connected to the input node 6.

This embodiment is identical in construction with Embodiment 1 except the above. No description will be repeated on the identical parts.

In Embodiments 1 to 4 the PMOS and NMOS transistors 15a and 15b are connected in series to the PMOS and NMOS transistors 5a and 5b to limit the output from the feedback inverter 15 to the intermediate node 7, but in Embodiment 10 the transmission gate 20 is connected to the output of the inverter 19 composed of the PMOS and NMOS transistors 5a and 5b so that the transmission gate 20 is controlled in accordance with the signal at the input node 6, thereby limiting the output from the inverter 19 to the intermediate node 7.

Accordingly, this embodiment produces about the same effect as that obtainable with Embodiment.

The feedback inverter in this embodiment is a modified form of the feedback inverter 15 in Embodiment 1, but it can freely applied to the feedback inverters depicted in FIGS. 3 to 5 and the hysteresis width control circuit 18 in FIG. 5.

EFFECT OF THE INVENTION

According to the first aspect of the present invention, the Schmitt circuit is provided with there is provided a feedback inverter which limits the intensity of its output signal to the intermediate node in accordance with a signal from the input node. By limiting the output to the intermediate node from the feedback inverter which functions to expand the hysteresis width, it is possible to narrow the hysteresis width.

According to the second aspect of the present invention, the Schmitt circuit is provided with a NOR circuit which outputs the NOR of a control signal and a signal from the input node and a feedback inverter which limits the intensity of its output signal to the intermediate node in accordance with the signal from the input node. When the signal from the input node does not require the Schmitt input function, a control signal is used to fix the level at the output node high, by which it is possible to prevent a useless current from flowing across the Schmitt circuit even if the terminal voltage is at an intermediate potential.

According to the third aspect of the present invention, the Schmitt circuit is provided with a NAND circuit which outputs the NAND of a control signal and a signal from the input node and a feedback inverter which limits the intensity of its output signal to the intermediate node in accordance with the signal from the input node. When the signal from the input node does not require the Schmitt input function, a control signal is used to fix the level at the output node low, by which it is possible to prevent a useless current from flowing across the Schmitt circuit even if the terminal voltage is at an intermediate potential.

According to another aspect of the present invention, the Schmitt circuit is provided with a hysteresis width control circuit which operates under the control of a hysteresis width control signal and inverts a signal from the output node and outputs the inverted signal to the intermediate node while at the same time limiting the intensity of its output signal to the intermediate node in accordance with a signal from the input node. By actuating the hysteresis width control circuit in response to the hysteresis width control signal, the feedback signal from the feedback inverter to the intermediate node is added with an intensity-limited output signal, and hence it becomes large, making it possible to expand the hysteresis width.

According to another aspect of the present invention, the Schmitt circuit is provided with a feedback inverter in which: a power supply, first and second PMOS transistors, first and second NMOS transistors and a low power supply are connected in series in this order; the connection point of the second PMOS transistor and the first NMOS transistor is connected to the intermediate node; the second PMOS transistor and the NMOS transistor have their gates connected to the output node, and the second PMOS transistor and the first NMOS transistor have their gates connected to the input node; or the second PMOS transistor and the first NMOS transistor have their gates connected to the output node; and the first PMOS transistor and the second NMOS transistor have their gates connected to the input node. By limiting the output to the intermediate node from the feedback inverter which functions to expand the hysteresis width, it is possible to narrow the hysteresis a width, and at the same time, the feedback inverter can easily be formed by a series connection of the PMOS and NMOS transistors.

According to another aspect of the present invention the Schmitt circuit is provided with a feedback inverter in which: first and second NMOS transistors and a low power supply are connected in series in this order; the connection point of the first and second NMOS transistors is connected to the intermediate node; and the second NMOS transistor has its gate connected to the output node, and the first NMOS transistor has its gate connected to the input node; or the first NMOS transistor has its gate connected to the output node, and the second NMOS transistor has its gate connected to the input node. By limiting the output to the intermediate node from the feedback inverter which does not exhibit any hysteresis when the signal level at the input node changes from the "L" to "H" level and which functions to expand the hysteresis width when the signal level at the input node changes from the "H" to "L" level, the hysteresis width can be narrowed and the feedback inverter can easily be constructed by a series connection of the first and second NMOS transistors.

According to another aspect of the present invention, the Schmitt circuit is provided with a feedback inverter in which: a power supply, first and second PMOS transistors are connected in series in this order; the connection point of the first and second PMOS transistors is connected to the intermediate node; and the first PMOS transistor has its gate connected to the output node, and the second PMOS transistor has its gate connected to the input node; or the second PMOS transistor has its gate connected to the output node, and the first NMOS transistor has its gate connected to the input node. By limiting the output to the intermediate node from the feedback inverter which does not exhibit any hysteresis when the signal level at the input node changes from the "H" to "L" level and which functions to expand the hysteresis width when the signal level at the input node changes from the "L" to "H" level, the hysteresis width can be narrowed and the feedback inverter can easily be constructed by a series connection of the first and second PMOS transistors.

According to still another aspect of the present invention, the Schmitt circuit is provided with a feedback inverter which has: an inverter circuit wherein a power supply, a first PMOS transistor, a first NMOS transistor and a low power supply are connected in this order, the first PMOS and NMOS transistors having their gates connected to the output node; and a switching circuit wherein second PMOS and NMOS transistors are connected in opposing relation to each other, the second PMOS and NMOS transistors having their gates connected to the input node, and which limits the intensity of the output signal to the intermediate node via the connection point of the first PMOS and NMOS transistors of the inverter circuit. The hysteresis width can be narrowed by only the additional provision of the switching circuit and the feedback inverter can be constructed with ease.

It will be apparent that many modifications and variations may be effected without departing from the scope of the novel concepts of the present invention.

What is claimed is:

1. A Schmitt circuit comprising:
   an input side inverter which inverts a signal from an input node and outputs it to an intermediate node;
   an output side inverter which inverts a signal from said intermediate node and outputs it to an output node;
   a feedback inverter which inverts a signal from said output node and outputs it to said intermediate node while at the same time limiting the output intensity of said signal to said intermediate node in accordance with said signal from said input node, and
   a hysteresis width control circuit which is actuated in response to a hysteresis width control signal and inverts a signal from said output node and outputs it to said intermediate node while at the same time limiting the output intensity of said signal to said intermediate node in accordance with said signal from said input node.

2. A Schmitt circuit comprising:
   an input side inverter which inverts a signal from an input node and outputs it to an intermediate node;
   an output side inverter which inverts a signal from said intermediate node and outputs it to an output node; and
   a feedback inverter which inverts a signal from said output node and outputs it to said intermediate node while at the same time limiting the output intensity of said signal to said intermediate node in accordance with said signal from said input node,
   wherein said feedback inverter comprises: an inverter in which a power supply, a first PMOS transistor, a first NMOS transistor and a low power supply are connected in this order, said first PMOS and NMOS transistors having their gates connected to said output node; and a switching circuit in which second PMOS and NMOS transistors are connected in opposing relation to each other, said second PMOS and NMOS transistors having their gates connected to said input node, and which limits the intensity of the output signal to said intermediate node via the connection point of said first PMOS and NMOS transistors of said inverter.

3. A Schmitt circuit comprising:
   a NOR circuit which outputs the NOR of a control signal and a signal from an input node to an intermediate node;
   an output side inverter which inverts a signal from said intermediate node and outputs it to an output node;
   a feedback inverter which inverts a signal from said output node and outputs it to said intermediate node while at the same time limiting the output intensity of said signal to said intermediate node in accordance with said signal from said input node; and
   a hysteresis width control circuit which is actuated in response to a hysteresis width control signal and inverts a signal from said output node and outputs it to said intermediate node while at the same time limiting the output intensity of said signal to said intermediate node in accordance with said signal from said input node.

4. The Schmitt circuit according to claim 3, wherein said feedback inverter has a construction in which: a power supply, first and second PMOS transistors, first and second NMOS transistors and a low power supply are connected in series in this order; the connection point of said second PMOS transistor and said first NMOS transistor is connected to said intermediate node; said first PMOS transistor and said second NMOS transistor have their gates connected to said output node, and said second PMOS transistor and said first NMOS transistor have their gates connected to said input node; or said second PMOS transistor and said first NMOS transistor have their gates connected to said output node, and said first PMOS transistor and said second NMOS transistor have their gates connected to said input node.

5. The Schmitt circuit according to claim 3, wherein said feedback inverter has a construction in which: first and second NMOS transistors and a low power supply are connected in series in this order; one side of said first NMOS transistor, which is neither its gate side nor another side connected to said second NMOS, is connected to said intermediate node; and said second NMOS transistor has its gate connected to said output node, said first NMOS transistor has its gate connected to said input node; or said first NMOS transistor has its gate connected to said output node, and said second NMOS transistor has its gate connected to said input node.

6. The Schmitt circuit according to claim 3, wherein said feedback inverter has a construction in which: a power supply, first and second PMOS transistors are connected in series in this order; one side of said second PMOS transistor, which is neither its gate side nor another side connected to said first PMOS, is connected to said intermediate node; and said first PMOS transistor has its gate connected to said output node, and said second PMOS transistor has its gate connected to said input node; or said second PMOS transistor has its gate connected to said output node, and said first PMOS transistor has its gate connected to said input node.

7. A Schmitt circuit comprising:

a NOR circuit which outputs the NOR of a control signal and a signal from an input node to an intermediate node;

an output side inverter which inverts a signal from said intermediate node and outputs it to an output node; and a feedback inverter which inverts a signal from said output node and outputs it to said intermediate node while at the same time limiting the output intensity of said signal to said intermediate node in accordance with said signal from said input node, wherein said feedback inverter comprises: an inverter in which a power supply, a first PMOS transistor, a first NMOS transistor and a low power supply are connected in this order, said first PMOS and NMOS transistors having their gates connected to said output node; and a switching circuit in which second PMOS and NMOS transistors are connected in opposing relation to each other, said second PMOS and NMOS transistors having their gates connected to said input node, and which limits the intensity of the output signal to said intermediate node via the connection point of said first PMOS and NMOS transistors of said inverter.

8. A Schmitt circuit comprising:

a NAND circuit which outputs the NAND of a control signal and a signal from an input node to an intermediate node;

an output side inverter which inverts a signal from said intermediate node and outputs it to an output node;

a feedback inverter which inverts a signal from said output node and outputs it to said intermediate node while at the same time limiting the output intensity of said signal to said intermediate node in accordance with said signal from said input node; and a hysteresis width control circuit which is actuated in response to a hysteresis width control signal and inverts a signal from said output node and outputs it to said intermediate node while at the same time limiting the output intensity of said signal to said intermediate node in accordance with said signal from said input node.

9. The Schmitt circuit according to claim 8, wherein said feedback inverter has a construction in which: a power supply, first and second PMOS transistors, first and second NMOS transistors and a low power supply are connected in series in this order; the connection point of said second PMOS transistor and said first NMOS transistor is connected to said intermediate node; said first PMOS transistor and said second NMOS transistor have their gates connected to said output node, and said second PMOS transistor and said first NMOS transistor have their gates connected to said input node; or said second PMOS transistor and said first NMOS transistor have their gates connected to said output node, and said first PMOS transistor and said second NMOS transistor have their gates connected to said input node.

10. The Schmitt circuit according to claim 8, wherein said feedback inverter has a construction in which: first and second NMOS transistors and a low power supply are connected in series in this order; one side of said first NMOS transistor, which is neither its gate side nor another side connected to said second NMOS, is connected to said intermediate node; and said second NMOS transistor has its gate connected to said output node, said first NMOS transistor has its gate connected to said input node; or said first NMOS transistor has its gate connected to said output node, and said second NMOS transistor has its gate connected to said input node.

11. The Schmitt circuit according to claim 8, wherein said feedback inverter has a construction in which: a power supply, first and second PMOS transistors are connected in series in this order; one side of said second PMOS transistor, which is neither its gate side nor another side connected to said first PMOS, is connected to said intermediate node; and said first PMOS transistor has its gate connected to said output node, and said second PMOS transistor has its gate connected to said input node; or said second PMOS transistor has its gate connected to said output node, and said first PMOS transistor has its gate connected to said input node.

12. A Schmitt circuit comprising:

a NAND circuit which outputs the NAND of a control signal and a signal from an input node to an intermediate node;

an output side inverter which inverts a signal from said intermediate node and outputs it to an output node; and a feedback inverter which inverts a signal from said output node and outputs it to said intermediate node while at the same time limiting the output intensity of said signal to said intermediate node in accordance with said signal from said input node, wherein said feedback inverter comprises: an inverter in which a power supply, a first PMOS transistor, a first NMOS transistor and a low power supply are connected in this order, said first PMOS and NMOS transistors having their gates connected to said output node; and a switching circuit in which second PMOS and NMOS transistors are connected in opposing relation to each other, said second PMOS and NMOS transistors having their gates connected to said input node, and which limits the intensity of the output signal to said intermediate node via the connection point of said first PMOS and NMOS transistors of said inverter.

* * * * *

UNITED STATES PATENT AND TRADEMARK OFFICE
CERTIFICATE OF CORRECTION

PATENT NO.   : 6,388,487 B1
DATED        : May 14, 2002
INVENTOR(S)  : Shinichi Hirose It is certified that error appears in the above-identified patent and that said Letters Patent is hereby corrected as shown below:

Please replace FIG. 4B, on shee 4 of 12, with the following revised FIG. 4B.

FIG.4B

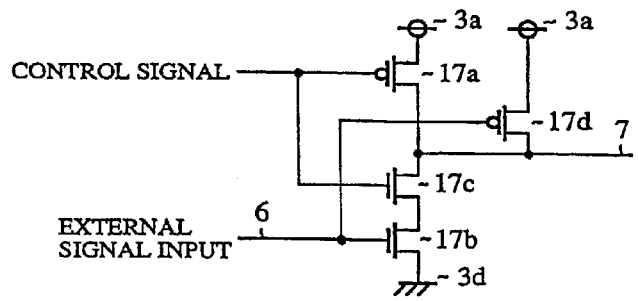

Signed and Sealed this

Eleventh Day of March, 2003

JAMES E. ROGAN
*Director of the United States Patent and Trademark Office*